(12) United States Patent
Kuo

(10) Patent No.: US 7,324,382 B2
(45) Date of Patent: Jan. 29, 2008

(54) CURRENT-MODE SENSING STRUCTURE USED IN HIGH-DENSITY MULTIPLE-PORT REGISTER IN LOGIC PROCESSING AND METHOD FOR THE SAME

(75) Inventor: Jew-Yong Kuo, Shanghai (CN)

(73) Assignee: Grace Semiconductor Manufacturing Corporation, Shanghai (CN)

( * ) Notice: Subject to any disclaimer, the term of this patent is extended or adjusted under 35 U.S.C. 154(b) by 37 days.

(21) Appl. No.: 11/443,037

(22) Filed: May 31, 2006

(65) Prior Publication Data

US 2007/0279991 A1    Dec. 6, 2007

(51) Int. Cl.
*G11C 11/34* (2006.01)
*G11C 16/06* (2006.01)
(52) U.S. Cl. .............................. 365/185.21; 365/185.2; 365/210
(58) Field of Classification Search ........... 365/185.21, 365/185.2, 210, 207
See application file for complete search history.

(56) References Cited

U.S. PATENT DOCUMENTS

| 6,469,937 | B2 * | 10/2002 | Fuchigami et al. .... 365/185.21 |
| 6,507,523 | B2 * | 1/2003 | Pekny ................... 365/189.09 |
| 6,834,024 | B2 * | 12/2004 | Frydel .................. 365/230.05 |
| 2002/0060939 | A1 * | 5/2002 | Kuo et al. ................. 365/207 |

* cited by examiner

*Primary Examiner*—Anh Phung
*Assistant Examiner*—Toan Le
(74) *Attorney, Agent, or Firm*—Rosenberg, Klein & Lee

(57) ABSTRACT

A current-mode sensing structure used in a high-density multiple-port register in logic processing and a method for the same are proposed. First, a reference current is defined by a dummy word line of a dummy cell and output. A multiple-port register file cell is then used to send out a select signal of "0" or "1" and output a cell current according to the select signal and the reference current. Finally, the cell current and the reference current are sent to a current comparator amplifier, which senses and outputs a difference value between the cell current and the reference current to perform session at once (SAO) recording. Because the difference value has only two possibilities: the reference current or its negative, the sensing time of the current comparator amplifier can be shortened.

13 Claims, 4 Drawing Sheets

CURRENT-MODE SENSING STRUCTURE USED IN HIGH-DENSITY MULTIPLE-PORT REGISTER IN LOGIC PROCESSING AND METHOD FOR THE SAME

BACKGROUND OF THE INVENTION

1. Field of the Invention

The present invention relates to a high-density multiple-port register sensing circuit and, more particularly, to a current-mode sensing structure used in a high-density multiple-port register in logic processing and a method for the same.

2. Description of Related Art

Generally speaking, the design of multiple-port register predominantly adopts the single-ended voltage sensing scheme. As shown in FIG. 1, a 5-port register file cell 10 has two ports for writing, respectively having bit lines $WBL_1$ and $WBL_2$ and word lines $WWL_1$ and $WWL_2$, and three ports for reading, respectively having bit lines $RDL_1$, $RBL_2$ and $RBL_3$ and word lines $RWL_1$, $RWL_2$ and $RWL_3$. After the bit line $RBL_3$ of the 5-port register file cell inputs a voltage V(b1) to a single-ended voltage-mode sensing amplifier (VSA) 12, the VSA 12 will sense the input voltage and then send it out.

The voltage sensing scheme has the drawbacks of a low speed and a too small dynamic noise margin. The sense voltage input to the voltage sensing scheme needs to be large enough. Moreover, in a high-density register, the larger the load of a bit line, the longer the sensing time, as the following equation shows $$T(\text{sense}) = C(b1) \times V(\text{sense}) / I_{cell}$$

where $C(b1)$ is the resistance of a bit line in the multiple-port register, and $I_{cell}$ is the current input from the multiple-port register to the voltage sensing scheme. Because the sense voltage is large, the sensing time is relatively long. Besides, because the voltage sensing scheme is single-ended, the common mode rejection ratio (CMRR) is inferior, causing a larger error.

The present invention aims to propose a current-mode sensing structure used in a high-density multiple-port register in logic processing and a method for the same to effectively solve the above problems in the prior art.

SUMMARY OF THE INVENTION

An object of the present invention is to provide a current-mode sensing structure used in a high-density multiple-port register in logic processing and a method for the same, in which a dummy cell is used to output a reference current for comparison with a current of a multiple-port register file cell to obtain a comparison result of the reference current or its negative, thereby shortening the sensing time of the current comparator amplifier.

Another object of the present invention is to provide a current-mode sensing structure used in a high-density multiple-port register in logic processing and a method for the same, in which a select signal is input to a multiple-port register file cell to let the cell current of the multiple-port register file cell be 0 or twice the reference current.

Another object of the present invention is to provide a current-mode sensing structure used in a high-density multiple-port register in logic processing and a method for the same, in which a dummy cell is used to input a current to a current comparator amplifier so as to shorten the sensing time and enlarge the dynamic noise margin.

To achieve the above objects, the present invention provides a current-mode sensing structure used in a high-density multiple-port register in logic processing and a method for the same. A reference current is defined by a dummy word line of a dummy cell and then output. A multiple-port register file cell is used to send out a select signal of "0" or "1". A cell current is output according to the select signal and the reference current. If the select signal is "1", the cell current is close to 0; if the select signal is "0", the cell current is twice the reference current. Both the cell current and the reference current are sent to a current comparator amplifier, which senses and outputs a difference value between the cell current and the reference current to perform session at once (SAO) recording. Because the difference value has only two possibilities: the reference current or its negative, the sensing time of the current comparator amplifier can be shortened.

BRIEF DESCRIPTION OF THE DRAWINGS

The various objects and advantages of the present invention will be more readily understood from the following detailed description when read in conjunction with the appended drawing, in which.

DETAILED DESCRIPTION OF THE PREFERRED EMBODIMENTS

Figure 1:
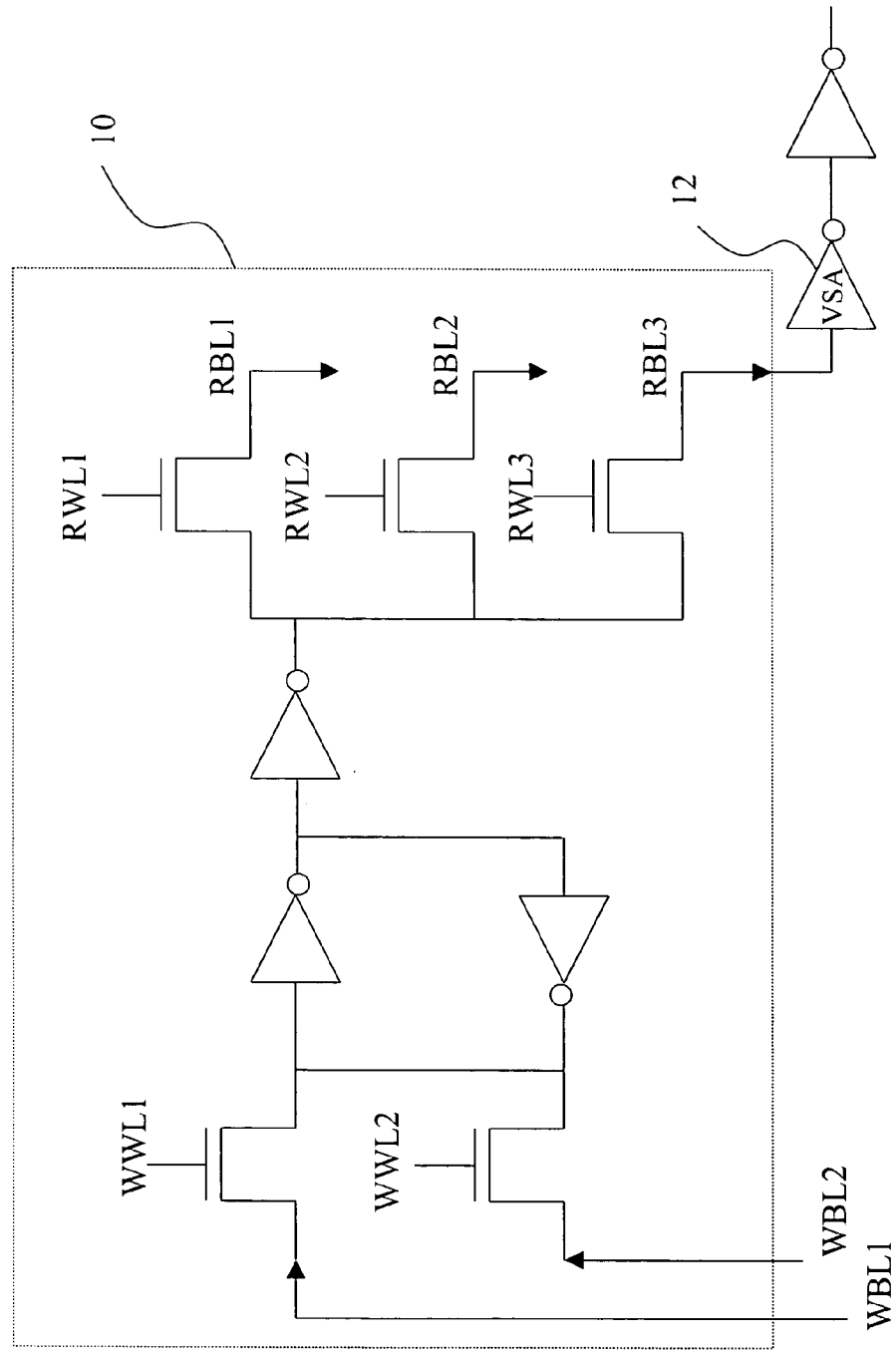
FIG. 1 is a diagram of the single-ended voltage sensing scheme in the prior art.
Figure 2:
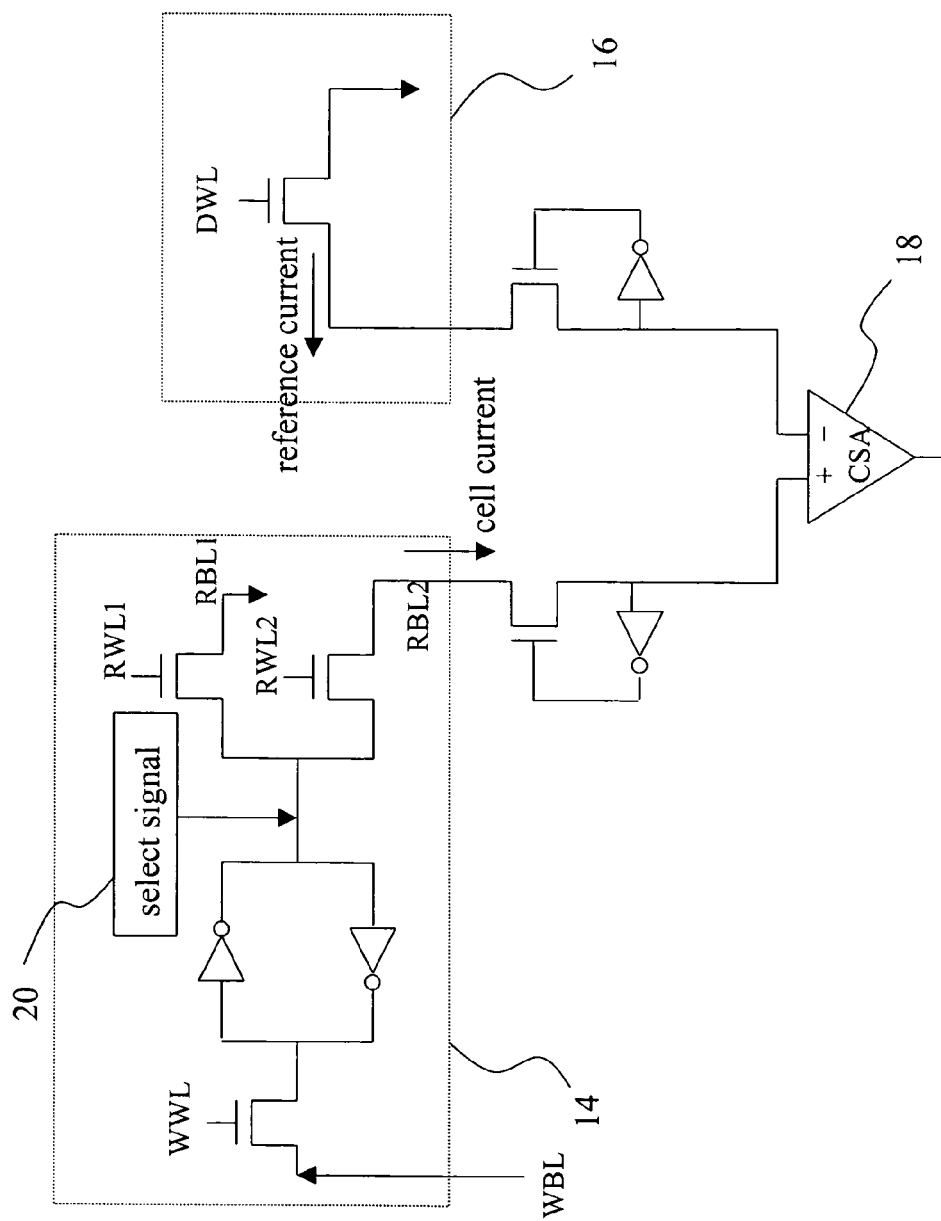
FIG. 2 is a diagram of the architecture of the present invention.

The present invention provides a current-mode sensing structure used in a high-density multiple-port register in logic processing and a method for the same. As shown in FIG. 2, the current-mode sensing structure comprises a 3-port register file cell 14, a dummy cell 16 and a current comparator amplifier 18. The 3-port register file cell 14 has a port for writing and two ports for reading. The three ports have bit lines WBL, $RBL_1$ and $RBL_2$ and word lines WWL, $RWL_1$ and $RWL_2$, respectively. In front of the reading ports, a select signal 20 is input externally. The 3-port register file cell 14 outputs a cell current $I_{cell}$. The dummy cell 16 can have a plurality of gates each connected to a bit line and a word line. In FIG. 2, the dummy cell 16 has only a gate. The size of the gate is half that of the gate in the 3-port register file cell 14. The dummy word line DWL is connected to the dummy cell 16, and defines a reference current $I_{ref}$. The current comparator amplifier 18 is a current-mode sensing amplifier (CSA).

Figure 3:
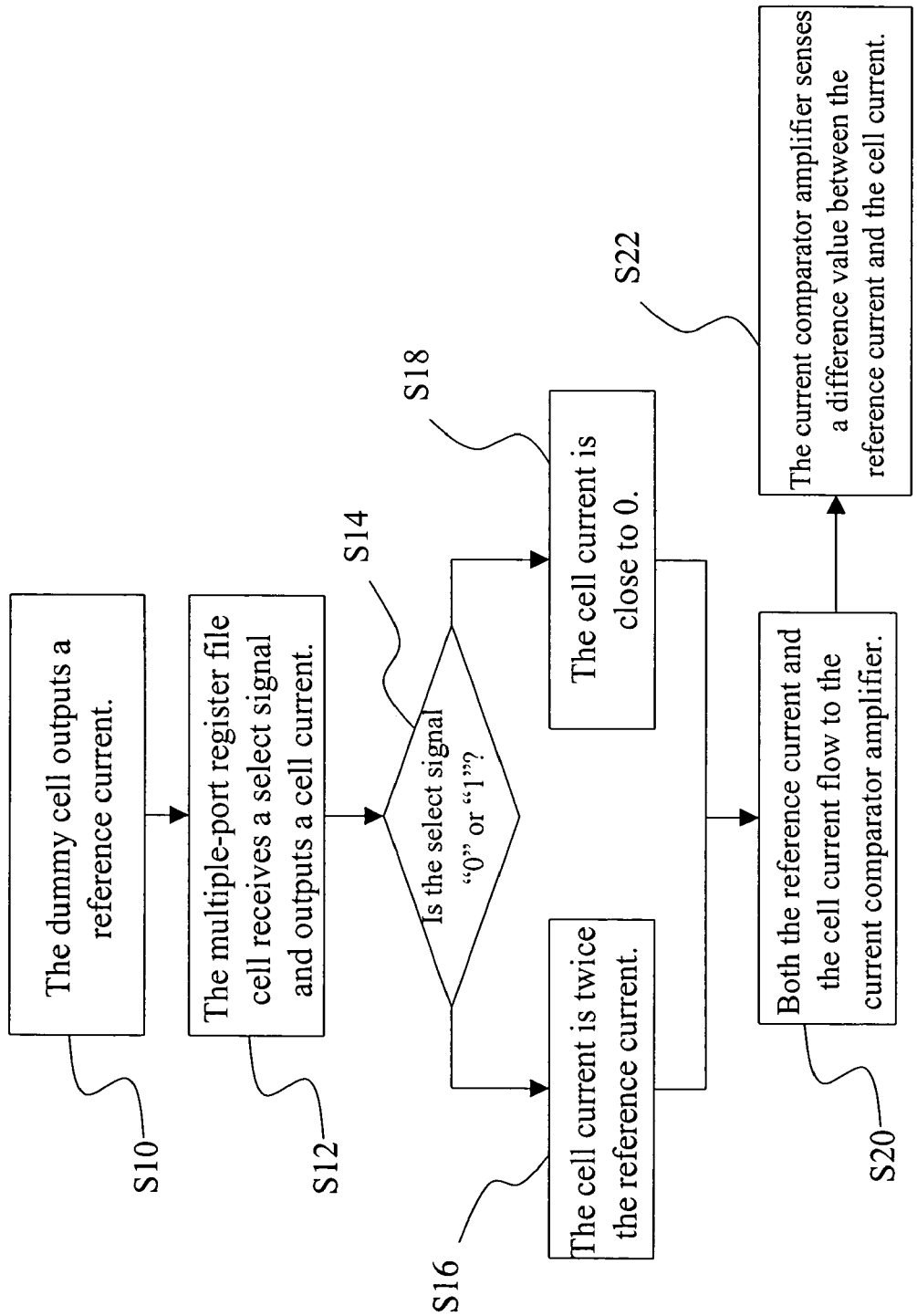
FIG. 3 is a flowchart of the method of the present invention.

FIG. 3 is a flowchart of the method of the present invention. After the dummy word line DWL defines the reference current $I_{ref}$, the dummy cell 16 outputs the reference current $I_{ref}$ to the current comparator amplifier 18 (Step S10). Next, as described by steps S12 to S18, the select signal 20 input externally can be used to determine what the cell current $I_{cell}$ output by the 3-port register file cell 14 is. Because the reference current $I_{ref}$ defined in the present invention is $½ \times I_{cell}$, when the select signal 20 is "0", the cell current $I_{cell}$ is twice the reference current $I_{ref}$. On the contrary, when the select signal 20 is "1", the cell current $I_{cell}$ is close to 0. No matter the cell current $I_{cell}$ is close to 0 or twice the reference current $I_{ref}$, the bit line RBL$_2$ in the 3-port register file cell 14 will output the cell current $I_{cell}$ to the current comparator amplifier 18. Subsequently, as described by steps S20 to S22, after both the reference current $I_{ref}$ and the cell current $I_{cell}$ flow to the current comparator amplifier 18, the current comparator amplifier 18 will compare these two currents and sense and output a difference value between them to perform session at once (SAO) recording.

Figure 4:
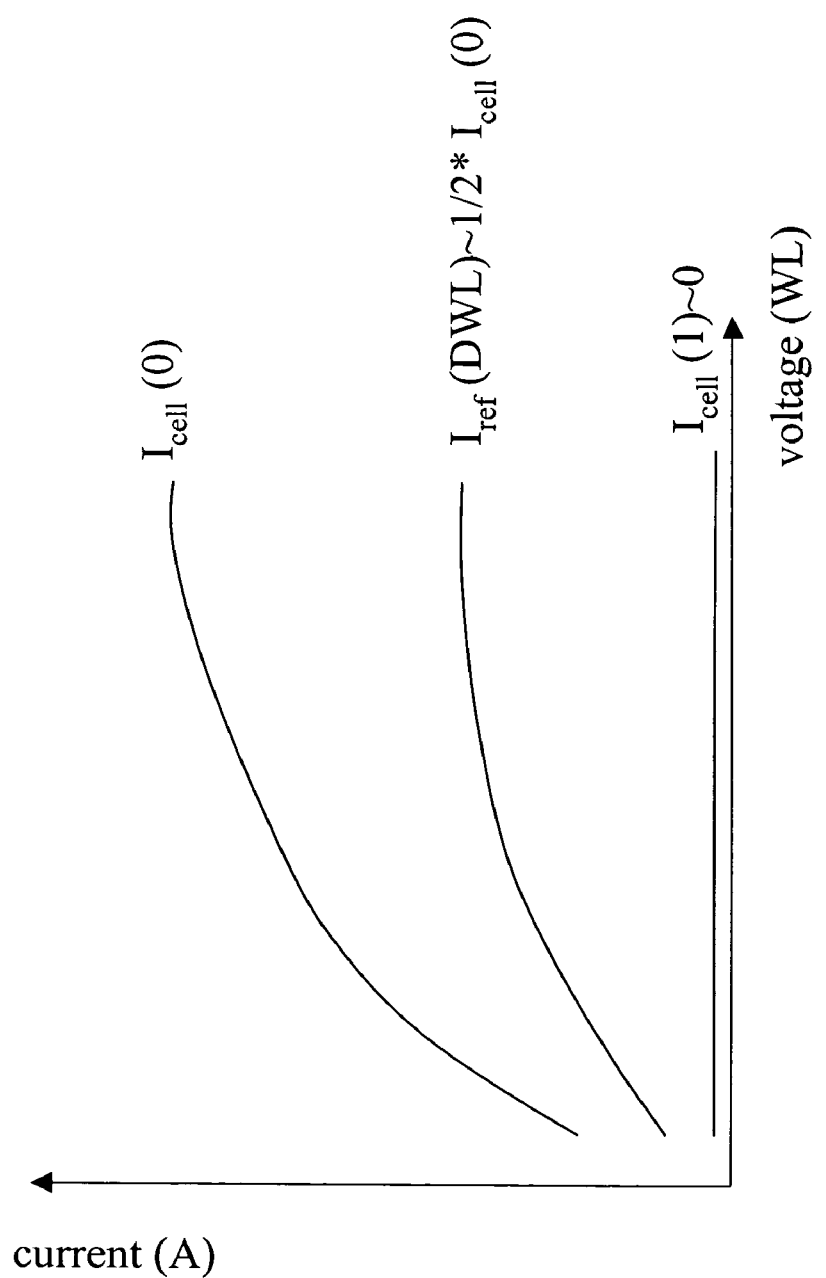
FIG. 4 is a diagram showing the relationships of cell current and reference current relative to voltage in the present invention.

FIG. 4 is a diagram showing the relationships of the cell current provided by the 3-port register file cell and the reference current provided by the dummy cell relative to the voltage. As can be seen in this figure, when the select signal is "0", the difference value between these two currents $\Delta I = I_{cell}(0) - I_{ref} \approx 2I_{ref} - I_{ref} = I_{ref}$; when the select signal is "1", the difference value between these two currents $\Delta I = I_{cell}(1) - I_{ref} = -I_{ref}$. Because the difference value has only two possibilities: the reference current $I_{ref}$ or its negative $-I_{ref}$ and the reference current $I_{ref}$ is defined by the dummy word line, the sense speed of the current comparator amplifier can be enhanced to greatly shorten the sensing time and also obtain a better dynamic noise margin.

To sum up, the present invention proposes a current-mode sensing structure used in a high-density multiple-port register in logic processing and a method for the same, in which a current-mode sensing system is adopted, and a dummy cell is used to output a reference current to a differential current comparator amplifier. Because the difference value between the reference current and the cell current is the reference current or its negative and the reference current is defined by the dummy word line and the size of the dummy cell is only half that of the gate in the multiple-port register file cell, the current comparator amplifier of the present invention has a shorter sensing time and a better dynamic noise margin as compared to voltage-mode sensing amplifiers used in the prior art.

Although the present invention has been described with reference to the preferred embodiment thereof, it will be understood that the invention is not limited to the details thereof. Various substitutions and modifications have been suggested in the foregoing description, and other will occur to those of ordinary skill in the art. Therefore, all such substitutions and modifications are intended to be embraced within the scope of the invention as defined in the appended claims.

I claim:

1. A current-mode sensing structure used in a high-density multiple register in logic processing, said current-mode sensing structure comprising:
    a multiple-port register file cell for receiving a select signal of "0" or "1" and outputting a cell current according to said select signal;
    a dummy cell for outputting a reference current defined by a dummy word line; and
    a current comparator amplifier for sensing a difference value between said cell current and said reference current and then outputting said difference value to perform session at once (SAO) recording.

2. The current-mode sensing structure as claimed in claim 1, wherein said current comparator amplifier is set up on a differential circuit.

3. The current-mode sensing structure as claimed in claim 1, wherein the magnitude of said reference current is half that of said cell current.

4. The current-mode sensing structure as claimed in claim 1, wherein the size of a gate of said dummy cell is half that of a gate in said multiple-port register file cell.

5. The current-mode sensing structure as claimed in claim 1, wherein said select signal is input externally.

6. The current-mode sensing structure as claimed in claim 1, wherein said difference value is said reference current when said select signal is "0".

7. The current-mode sensing structure as claimed in claim 1, wherein said difference value is the negative of said reference current when said select signal is "1".

8. A current-mode sensing method used in a high-density multiple register in logic processing, said current-mode sensing method comprising the steps of:
    using a dummy cell to output a reference current defined by a dummy word line of said dummy cell;
    using a multiple-port register file cell to receive a select signal of "0" or "1" and outputting a cell current according to said select signal and said reference current; and
    sending said cell current and said reference current to a current comparator amplifier to sense a difference value between said cell current and said reference current and then outputting said difference value to perform session at once (SAO) recording.

9. The current-mode sensing method as claimed in claim 8, wherein the magnitude of said reference current is half that of said cell current.

10. The current-mode sensing method as claimed in claim 8, wherein the size of a gate of said dummy cell is half that of a gate in said multiple-port register file cell.

11. The current-mode sensing method as claimed in claim 8, wherein said select signal is input externally.

12. The current-mode sensing method as claimed in claim 8, wherein said difference value is said reference current when said select signal is "0".

13. The current-mode sensing method as claimed in claim 8, wherein said difference value is the negative of said reference current when said select signal is "1".

* * * * *